United States Patent
Harriman et al.

(10) Patent No.: US 12,362,741 B2
(45) Date of Patent: Jul. 15, 2025

(54) GATE DRIVER WITH THERMAL MONITORING AND CURRENT SENSING

(71) Applicant: SEMICONDUCTOR COMPONENTS INDUSTRIES, LLC, Scottsdale, AZ (US)

(72) Inventors: Paul J. Harriman, Indian Harbour, FL (US); Thomas Patrick Duffy, Chandler, AZ (US); James George Hill, Cave Creek, AZ (US); Michael Scott Lay, Tempe, AZ (US); Margaret Spillane, Limerick (IE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 18/612,902

(22) Filed: Mar. 21, 2024

(65) Prior Publication Data
US 2024/0235543 A1    Jul. 11, 2024

Related U.S. Application Data

(63) Continuation of application No. 17/651,292, filed on Feb. 16, 2022, now Pat. No. 11,949,406.
(Continued)

(51) Int. Cl.
*H02M 1/08*    (2006.01)
*G01K 7/22*    (2006.01)
(Continued)

(52) U.S. Cl.
CPC ........... *H03K 17/0822* (2013.01); *G01K 7/22* (2013.01); *H02M 1/0009* (2021.05); *H02M 1/08* (2013.01);
(Continued)

(58) Field of Classification Search
CPC ...... H03K 17/0822; H03K 2017/0806; H02M 1/0009; H02M 1/08; H02M 3/158; G01K 7/22; G01K 2219/00
See application file for complete search history.

(56) References Cited

U.S. PATENT DOCUMENTS

| | | | |
|---|---|---|---|
| 10,972,088 B1 | 4/2021 | Barrenscheen et al. | |
| 2009/0002056 A1* | 1/2009 | Doyle | G01R 19/0092 327/512 |

(Continued)

*Primary Examiner* — Gary L Laxton
(74) *Attorney, Agent, or Firm* — Brake Hughes Bellermann LLP

(57) ABSTRACT

A driver can be configured to provide sensed phase currents as feedback to a controller to indicate the output currents from each phase of a switch mode power supply (SMPS). The driver can be configured to temperature compensate the sensed currents in one of two ways. If a temperature sensor is directly coupled to the driver, then the driver may be configured to temperature compensate the sensed currents from each phase based on a temperature measurement made by the temperature sensor. If a temperature sensor is not directly coupled to the driver, then the driver may be configured to temperature compensate the sensed current from each phase based on a temperature signal received from a bus coupled to the driver. The bus can communicate the temperature signal so that multiple drivers can utilize one temperature sensor.

19 Claims, 5 Drawing Sheets

Related U.S. Application Data

(60) Provisional application No. 63/180,488, filed on Apr. 27, 2021.

(51) Int. Cl.
*H02M 1/00* (2006.01)
*H02M 3/158* (2006.01)
*H03K 17/082* (2006.01)
*H03K 17/08* (2006.01)

(52) U.S. Cl.
CPC ........ *H02M 3/158* (2013.01); *G01K 2219/00* (2013.01); *H03K 2017/0806* (2013.01)

(56) References Cited

U.S. PATENT DOCUMENTS

| | | |
|---|---|---|
| 2014/0014839 A1 | 1/2014 | Chang et al. |
| 2015/0364995 A1* | 12/2015 | Chen .................. H02M 3/1584 323/271 |
| 2020/0014195 A1 | 1/2020 | Ye et al. |
| 2022/0300019 A1 | 9/2022 | Lawange et al. |
| 2023/0053639 A1 | 2/2023 | Netzer et al. |

* cited by examiner

GATE DRIVER WITH THERMAL MONITORING AND CURRENT SENSING

CROSS-REFERENCE TO RELATED APPLICATION

This continuation application claims priority to U.S. patent application Ser. No. 17/651,292 filed on Feb. 16, 2022, which claims the benefit of U.S. Provisional Application No. 63/180,488 filed on Apr. 27, 2021. These applications are hereby incorporated by reference, each in its entirety.

FIELD OF THE DISCLOSURE

The present disclosure relates to integrated circuits and more specifically to a driver for a switched mode power supply (SMPS).

BACKGROUND

An SMPS can include phases that are configured to provide a regulated output voltage at a current level determined by a sum of output currents from the phases. A controller of the multi-phase SMPS can be configured to receive feedback from the phases and based on this feedback, can control the output of the SMPS. The accuracy of the control can correspond to the accuracy of the feedback for a range of operating conditions.

SUMMARY

In at least one aspect, the present disclosure generally describes a driver for a multi-phase switched mode power supply. The driver includes a temperature sensing circuit that is configured to detect a temperature sensor at an input to the driver and based on the detection operate in a master mode or a slave mode. In the master mode, the temperature sensing circuit is configured to receive a temperature measurement from the temperature sensor and to convert the temperature measurement to a digital temperature signal that is provided to an internal bus that is internal to the driver. In the slave mode, the temperature sensing circuit is configured to receive a temperature signal from an external bus that is external to the driver and convert the temperature signal from the external bus to the digital temperature signal that is provided to the internal bus. The driver further includes a phase-current sensor circuit for each phase of the driver. Each phase-current sensor circuit is configured by the digital temperature signal to generate a temperature-compensated sensed current corresponding to a phase current output by the phase.

In another aspect, the present disclosure generally describes a method for generating a temperature compensated sensed current for each phase of a driver in a multi-phase switched mode power supply. The method includes determining when a temperature sensor is directly coupled to an input of the driver. The method further includes configuring the driver in a master mode to generate the digital temperature signal when the temperature sensor is coupled to the input of the driver and configuring the driver in a slave mode to generate the digital temperature signal when the temperature sensor is not coupled to the input of the driver. The method further includes transmitting the digital temperature signal to a plurality of phase-current sensors. Each of the plurality of phase-current sensors corresponds to a phase of the multi-phase switched mode power supply. The method further includes adjusting each of the plurality of phase-current sensors according to the digital temperature signal to generate a temperature-compensated sensed current at an output of each phase-current sensor.

In another aspect, the present disclosure generally describes a multi-phase switch mode power supply (SMPS). The SMPS includes a controller that is configured to output switching signals based on feedback from phases of the multi-phase SMPS. The feedback includes a sensed current from each phase. The SMPS further includes a first driver that is configured to generate driving signals based on the switching signal. The driving signal configures each of the phases to charge and discharge an inductor of the phase in order to generate a phase current. The first driver includes a temperature sensing circuit that is configured to detect a temperature sensor that is directly coupled to the first driver and generate a digital temperature signal based on a temperature measurement made by the temperature sensor directly coupled to the first driver. The first driver further includes phase-current sensors for each phase. The phase current sensors are adjusted by the digital temperature signal to temperature-compensate the sensed current from each phase coupled to the first driver.

In a possible implementation of the multi-phase SMPS, the temperature sensing circuit can be further configured to convert the digital temperature signal to an analog temperature signal and transmit the analog temperature signal to an external bus that is external to the first driver. The multi-phase SMPS can include a second driver that is coupled to the external bus. The second driver can include a temperature sensing circuit configured to receive the analog temperature signal from the external bus and generate the digital temperature signal based on the analog temperature signal received from the external bus. The second driver can further include phase-current sensors for each phase that are adjusted by the digital temperature signal to temperature-compensate the sensed current from each phase coupled to the first driver.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

Power can be supplied to high-power electronic applications using a multi-phase SMPS. The multi-phase SMPS can be configured to provide a regulated output voltage at a current level determined by a sum of the phases. Each phase may include a synchronous buck converter that includes an inductor coupled to a pair of metal oxide semiconductor field effect transistors (MOSFETs). For example, a high-side (H/S) MOSFET can be configured ON/OFF to couple/decouple the inductor to/from an upper rail voltage, while a low-side (L/S) MOSFET can be configured ON/OFF to couple/decouple the inductor to/from a lower rail voltage (e.g., ground). The H/S MOSFET and the L/S MOSFET can be configured ON/OFF in complementary fashion by switching signals generated by a controller. The controller may be configured to operate in a power domain (i.e., low-power domain) that is different than a power domain (i.e., high-power domain) of the MOSFETs. Accordingly, a gate driver for each phase of the SMPS may be configured to translate the switching signals generated by the controller into gate signals suitable for efficiently switching the H/S MOSFET and L/S MOSFET ON/OFF. The controller can be configured to receive feedback from an output of the SMPS and based on this feedback, can change (e.g., modulate) the switching signals in order to control the output of the SMPS. For example, the controller may modulate the switching signals based on a sensed current of the inductor in order to regulate the output current of the SMPS and/or to balance phase currents amongst the phases of the SMPS. The accuracy of the control may be affected by thermal conditions of the SMPS because the feedback may vary with temperature.

The present disclosure describes a driver for a multi-phase SMPS configured with circuitry and functionality to facilitate the generation of a monitored (i.e., sensed) phase current (IMON) for each phase that is accurate (e.g., temperature invariant) over a range of temperatures (e.g., 0° C. to 100° C.) The accuracy relies, at least in part, on a temperature measurement that can be obtained from (i) a temperature sensor coupled directly to a driver of a phase or (ii) from a bus configured to communicate the sensed phase temperature to the driver of the phase from another driver of another phase. By temperature compensating the measurement of a phase current at the driver, a controller of the SMPS can receive accurate feedback without the need for expensive integration (e.g., driver-MOSFET (DrMOS) modules), complicated communication (e.g., differential signals), or excessive part count or integrated circuit size (e.g., per phase temperature sensors, added pins, etc.).

Figure 1:
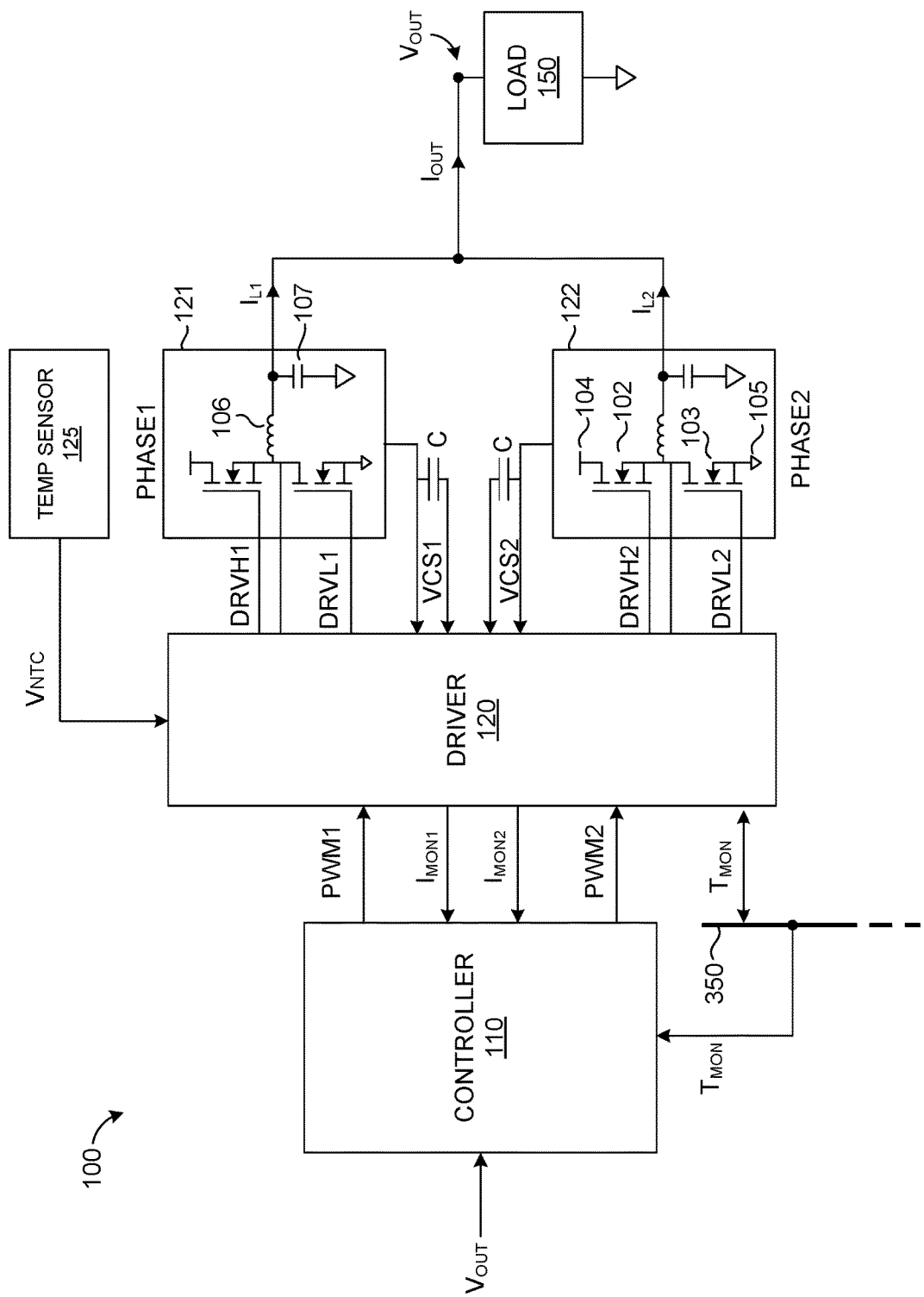
FIG. 1 is a block diagram of a multi-phase SMPS providing power to a load according to a possible implementation of the present disclosure.

FIG. 1 illustrates a block diagram of a multi-phase SMPS providing power to a load 150 according to a possible implementation of the present disclosure. As shown, the multi-phase SMPS 100 includes a first phase circuit (i.e., first phase 121) and a second phase circuit (i.e., second phase 122), though could include additional phase circuits (i.e., phases) in an alternate implementation. Each phase has a H/S MOSFET 102 coupled to an upper rail 104 of an output power domain and an L/S MOSFET 103 coupled to a lower rail 105 (e.g., a ground) of the output power domain. Each phase further includes an inductor 106 and a capacitor 107.

The multi-phase SMPS 100 further includes a controller 110 that is configured to output switching signals for each phase. As shown in FIG. 1, the controller 110 is configured to output a first switching signal (i.e., PWM1) for the first phase and a second switching signal (i.e., PWM2) for the second phase. The multi-phase SMPS 100 further includes a driver 120 configured to generate gate driving signals based on the switching signals. The gate driving signals may be in the output power domain while the switching signal may be in an input power domain. As shown in FIG. 1, the driver 120 is configured to generate a first H/S gate driving signal (i.e., DRVH1) and a (complementary) first L/S gate driving signal (i.e., DRVL1) based on the first switching signal (i.e., PWM1). The driver 120 is further configured to generate a second H/S gate driving signal (i.e., DRVH2) and a (complementary) second L/S gate driving signal (i.e., DRVL2) based on the second switching signal (i.e., PWM2). The driving signals control each phase to charge/discharge its corresponding inductor (e.g., inductor 106) so that (i) the capacitor of each phase (e.g., capacitor 107) is charged to an output voltage ($V_{OUT}$) and (ii) each phase outputs a phase current (i.e., $I_{L1}$, $I_{L2}$). The phase currents can be combined so that a load 150 receives an output current ($I_{OUT}$) that is the sum of the phase currents (i.e., $I_{L1}+I_{L2}$).

The controller 110 can be further configured to receive a variety of signals. For example, the controller may receive the output voltage ($V_{OUT}$) as feedback from the output of the SMPS. The controller 110 may be configured to adjust an aspect (e.g., duty cycle) of the switching signals (PWM1, PWM2) in response to a change in the output voltage ($V_{OUT}$) so that the output voltage is regulated at a particular value. The controller 110 may also receive an analog temperature signal ($T_{MON}$) corresponding to an approximate temperature of a phase. The driver 120 may be configured to generate the analog temperature signal ($T_{MON}$) from a temperature measurement made by a thermal sensor (i.e., temperature sensor 125) that is coupled directly to the driver 120. The temperature sensor 125 may be disposed proximate to one or both of the phases so that a signal output from the temperature sensor corresponds to an approximate temperature of the first phase 121 and/or the second phase 122. When the temperature sensor 125 is coupled directly to the driver 120, the driver 120 may be configured to generate the analog temperature signal ($T_{MON}$) and transmit the analog temperature signal ($T_{MON}$) to the analog-temperature bus 350 (i.e., $T_{MON}$ bus) where it can be shared with the controller 110. In a possible implementation, the analog-temperature bus 350 is coupled to other drivers (not shown) in order to provide the analog temperature signal ($T_{MON}$) to the other drivers.

The driver 120 may be further configured to (i) receive a first signal ($V_{CS1}$) from the first phase 121 and (ii) generate a temperature-compensated first sensed current ($I_{MON1}$) based on the first signal ($V_{CS1}$) and the approximate temperature of the first phase 121. The first sensed current ($I_{MON1}$) can correspond to the current ($I_{L1}$) flowing through the inductor of the first phase 121. In other words, the first sensed current ($I_{MON1}$) can correspond to the output current (i.e., phase current) of the first phase 121. Likewise, the driver 120 may be further configured to (i) receive a second signal ($V_{CS2}$) from the second phase 122 and (ii) generate a temperature-compensated first sensed current ($I_{MON2}$) based on the second signal and the approximate temperature of the second phase 122. The controller 110 can be configured to receive the sensed currents ($I_{MON1}$, $I_{MON2}$) from the phases for various uses.

The controller may be configured to use the sensed currents (IMONI, $I_{MON2}$) to control the phase current of each phase (i.e., current-mode control). For example, the controller 110 can be configured to receive the first sensed current ($I_{MON1}$) and adjust (e.g., modulate) the first switching signal (i.e., PWM1) based on the first sensed current. The first switching signal (PWM1) may be adjusted to help the first sensed current ($I_{MON1}$) satisfy a criterion. For example, the first switching signal (PWM1) can be pulse width modulated (PWM) with a duty cycle to adjust (e.g., regulate) the first phase current ($I_{L1}$) so that a difference (i.e., error) between the first phase current ($I_{L1}$) and a target level (i.e., reference level) is reduced (e.g., made approximately zero). Additionally (or alternatively), the controller may be configured to use the sensed currents to balance the phase currents for the phases so that one phase current is not significantly higher (or lower) than the other phases. Additionally (or alternatively), the controller may be configured to use the sensed currents for safety. For example, the controller 110 can be configured by the sensed currents to shut down the multi-phase SMPS if any (or all) of the sensed currents exceed a maximum current level. Accordingly, the accuracy of the sensed currents can correspond to the proper operation of the SMPS. Thus, it may be desirable to maintain an accuracy of the sensed current in all possible operating conditions of the SMPS (e.g., over a range of temperatures).

The disclosed driver is configured to apply temperature compensation to the sensed currents to reduce (e.g., remove) a temperature dependence in the sensed current signals ($I_{MON1}$, $I_{MON2}$) so that they are more accurate (i.e., vary less) over a range of temperatures. The temperature compensation can be applied before the sensed current signals are transmitted to the controller 110. By applying temperature compensation at the driver 120, complexities associated with communicating the current sensed signal between the output power domain of the phase and the input power domain of the controller 110 can be reduced. As a result, the multi-phase SMPS using the disclosed driver may have advantages including (but not limited to) smaller size, fewer parts (e.g., leads), and improved feedback accuracy (e.g., less noise).

Figure 2:
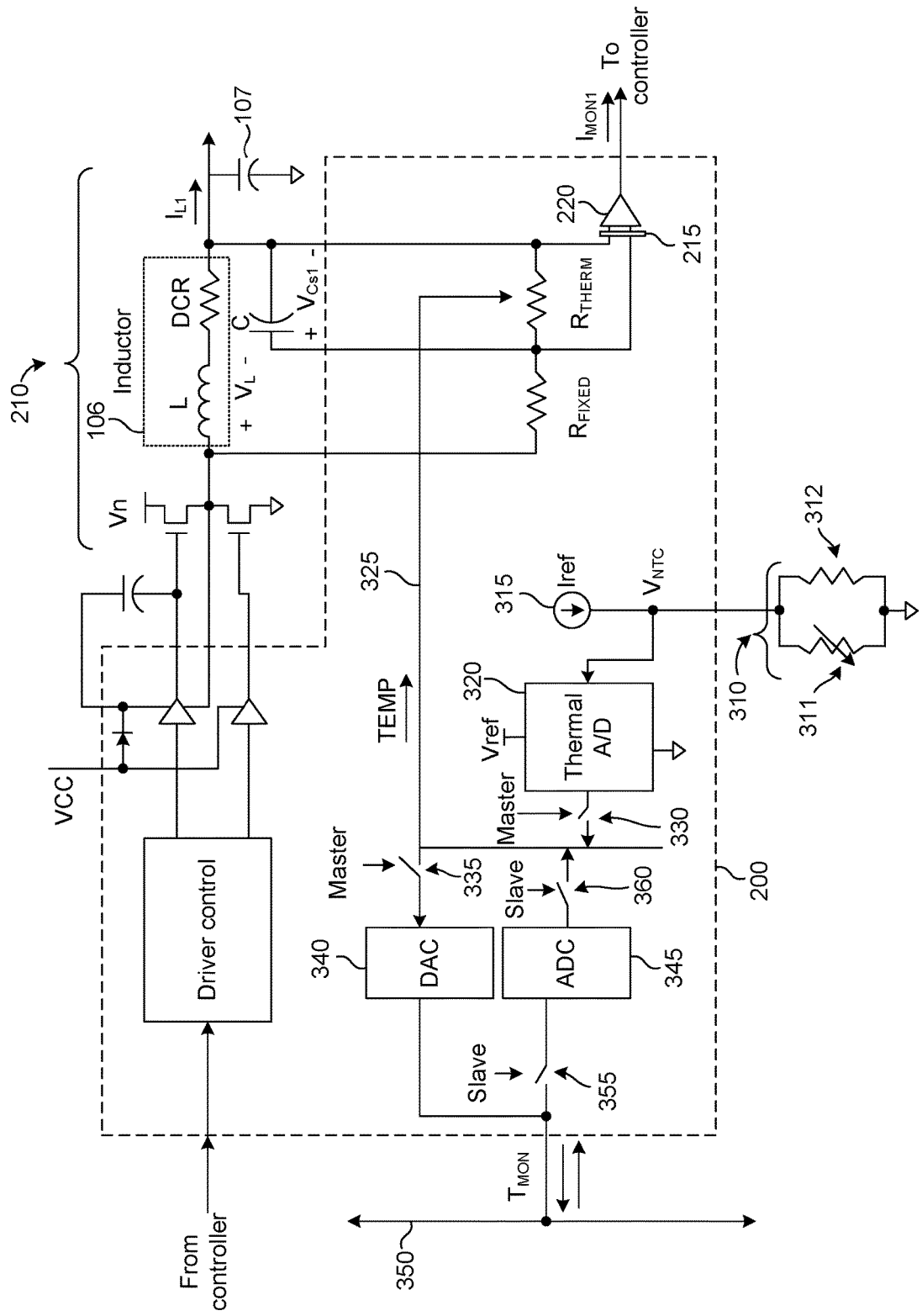
FIG. 2 illustrates a driver coupled to a phase according to an implementation of the present disclosure.

FIG. 2 schematically illustrates a gate driver (i.e., driver) according to a possible implementation of the present disclosure. To simplify the discussion, the driver 200 shown only includes circuitry for driving a single phase 210. It may be understood, however, that a driver can include similar circuitry to drive other phases in a multi-phase SMPS.

As shown in FIG. 2, the phase 210 coupled to the driver 200 includes an inductor 106 that includes an inductance (i.e., L) in series with a direct-current resistance (i.e., DCR). The DCR of the inductor 106 can be used to sense the phase current ($I_{L1}$) using DCR current sensing. In DCR current sensing, a fixed resistor ($R_{FIXED}$) and a capacitor (C) are arranged in series and coupled in parallel with the inductor 106 (i.e., in a DCR current sensing configuration). It can be shown that in this configuration, the voltage of the capacitor ($V_{CS1}$) can be made proportional to the inductor current ($I_{L1}$). In particular, (neglecting $R_{THERM}$) when $R_{FIXED} \cdot C = L/DCR$, then the voltage across the capacitor ($V_{CS1}$) may be proportional to the phase current ($I_{L1}$) by the resistance of the DCR as shown below:

$$V_{CS1} = I_{L1} \cdot DCR \quad (1)$$

$$I_{L1} = V_{CS1}/DCR \quad (2)$$

Put another way, when an RC time constant of the filter formed by $R_{FIXED}$ and C equals an L/R time constant of the filter formed by L and DCR, then poles and zeros of the circuit can be canceled, and a dependence of the sensed current on frequency can be removed. The sensed current ($I_{MON1}$) may still be temperature dependent, however, because DCR may vary over a range of temperatures (e.g., 0° C. to 100° C.).

To compensate for a temperature dependent DCR, the driver 200 can include a variable resistor ($R_{THERM}$) added in series with the fixed resistor ($R_{FIXED}$) and in parallel with the capacitor (C). The variable resistor ($R_{THERM}$) and the fixed resistor ($R_{FIXED}$) form a voltage divider that can be adjusted in order to adjust the capacitor voltage ($V_{CS1}$) to compensate for variations in DCR (e.g., caused by temperature variations). The ratio of the voltage divider (i.e., the resistance of $R_{THERM}$) may be controlled by a digital temperature signal (i.e., TEMP) corresponding to an approximate temperature of the phase measured by a thermal sensor 310 in order to make the appropriate adjustment for a particular temperature. For example, as the DCR increases with temperature, $R_{THERM}$ can be reduced so that the capacitor voltage ($V_{CS1}$) is reduced to compensate. In other words, an increase in DCR can be compensated for by a corresponding (e.g., equal and opposite) decrease in Vesi so that a measurement of the phase current includes less variation (e.g., no variation) with temperature.

The driver 200 further includes an amplifier 220 (e.g., transconductance amplifier) coupled to $R_{THERM}$ in order to amplify (e.g., with a gain ($g_m$)) the sensed current ($I_{MON1}$) for the phase 210 that is fed back to the controller 110. The amplifier 220 also acts as a buffer between the phase 210 and a controller 110. In some implementations, the driver 200 further includes a common-mode filter 215 between the variable resistor and the amplifier 220 to reduce (e.g., remove) a common mode signal from the voltage ($V_{CS1}$) at the input terminals of the amplifier 220.

While the driver shown in FIG. 2 is a single-phase driver, a multi-phase driver may include a voltage divider formed by the fixed resistor ($R_{FIXED}$), a temperature-controlled variable resistor ($R_{THERM}$), an amplifier, and (in some implementations) a common-mode filter for each phase. The driver 200 may not include the capacitor (C) used for the DCR current sensing because its integrated circuit (IC) implementation may be larger than desired. Instead, the capacitor (C) for DCR current sensing may be coupled to inputs of the driver 200.

The variable resistor ($R_{THERM}$) of the driver 200 can be implemented as a digital-to-analog converter (i.e., DAC, D/A) or as a digital potentiometer (i.e., digipot). Each implementation can be configured to provide a resistance when addressed by a digital temperature signal (i.e., TEMP). The resistance of the variable resistor may be controlled to have a nonlinear response to temperature (e.g., to match a nonlinear response of the DCR). The resistance of the variable resistor ($R_{THERM}$) may be controlled based on a digital temperature signal (i.e. TEMP), which can be generated by the driver 200 based on its mode of operation. The digital temperature signal (TEMP) can be a digital code that corresponds to a measured temperature of the phase 210 (e.g., $V_{NTC}$).

The driver 200 may be configured in a master mode or a slave mode (i.e., dual mode), where the master mode and the slave mode correspond to different switch configurations of the driver 200. In other words, the driver 200 can include a plurality of switches, including master switches and slave switches, that have states (ON/OFF) determined by the master mode and the slave mode. In the master mode, the master switches are configured ON (i.e., conduct), and the slave switches are configured OFF (i.e., do not conduct). In the slave mode, the slave switches are configured ON, and the master switches are configured OFF. The mode of the dual-mode driver may be determined by the presence (or absence) of a thermal sensor 310 coupled (e.g., externally) to the driver 200. For example, when the thermal sensor 310 is present, the driver 200 may be configured in the master mode, while when the thermal sensor 310 is absent, the driver 200 may be configured in the slave mode.

The thermal sensor 310 can include a negative temperature coefficient thermistor (i.e., NTC 311) having a resistance controlled by a temperature. The NTC 311 may be disposed proximate to one or more phases so that a resistance of the NTC 311 can correspond to a temperature of one or more DCRs of the one or more phases. In a possible implementation, the thermal sensor 310 can further include a resistance 312 coupled in parallel with the NTC 311 to improve a linearity of a (negative) temperature coefficient of the thermal sensor 310. In other words, an overall resistance of the thermal sensor 310 may change linearly over a temperature range (e.g., 0° C. to 100° C.) when the resistance 312 is coupled in parallel with the NTC 311.

The driver 200 may include a reference current source 315 configured to supply a current (e.g., at a fixed level) to the thermal sensor 310 in order to generate a temperature measurement voltage ($V_{NTC}$) that changes according to the overall resistance of the thermal sensor 310. The driver 200 may further include a detector to sense the presence (or absence) of the thermal sensor 310 coupled (directly) to the driver. The driver 200 may include circuitry (not shown) to generate switching signals to control the master switches and slave switches appropriately upon sensing a thermal sensor 310 coupled to the driver 200. For example, the temperature measurement voltage ($V_{NTC}$) may trigger switch configurations corresponding to the master mode or the slave mode based on a comparison between the temperature measurement voltage ($V_{NTC}$) and a mode threshold. The comparison may be based on the temperature measurement voltage ($V_{NTC}$) being higher when the thermal sensor 310 is present at (e.g., directly coupled to) the driver 200 than when the thermal sensor 310 is not present at (e.g., not directly coupled to) the driver 200, or vice versa.

The driver 200 may further include a thermal analog-to-digital (i.e., A/D, ADC) converter 320 that is configured to convert the temperature measurement voltage ($V_{NTC}$) into the digital temperature signal (TEMP). The conversion can be nonlinear so that the variable resistor ($R_{THERM}$) of the phase-current sensor can be controlled by the digital temperature signal (TEMP) to have a nonlinear response (e.g., resistance versus temperature). This nonlinear response may improve an accuracy of the sensed current ($I_{MON1}$) for the phase 210.

When the driver 200 is configured in the master mode, the thermal A/D converter 320 is coupled by a first master switch 330 to a digital-temperature bus 325. The digital-temperature bus 325 may supply the circuitry for sensing a phase current of the driver 200 (e.g., $R_{THERM}$) with the digital temperature signal (TEMP) so that the sensed current for the phase (e.g., $I_{MON1}$) can be temperature compensated. In other words, the digital temperature signal (TEMP) may be conveyed within the driver 200 (i.e., internally, locally) by the digital-temperature bus 325. In FIG. 2, a single variable resistor ($R_{THERM}$) is shown coupled to the digital-temperature bus 325; however, it may be understood that in a multi-phase driver, each phase can have a variable resistor that is coupled to the digital-temperature bus 325.

The driver may further include an output DAC 340. The output DAC 340 may be coupled to the digital-temperature bus 325 by a second master switch 335 to receive the digital temperature signal (TEMP) when the driver 200 is in the master mode. In the master mode, the output DAC 340 is configured to convert the digital temperature signal (TEMP) into an analog temperature signal ($T_{MON}$). The output DAC 340 is coupled to the analog-temperature bus 350 so that in the master mode the analog temperature signal ($T_{MON}$) is transmitted to the analog-temperature bus 350. The analog-temperature bus 350 is external to the driver 120 and can be used to convey the analog temperature signal ($T_{MON}$) to other drivers. In other words, the digital temperature signal (TEMP) used for temperature compensation is converted by the output DAC 340 to the analog temperature signal ($T_{MON}$) and transmitted from the driver 200 to the analog-temperature bus 350.

The driver 200 may further include an input ADC 345. The input ADC 345 may be coupled to the analog-temperature bus 350 by a first slave switch 355 to receive the analog temperature signal ($T_{MON}$) when the driver 200 is in the slave mode. The input ADC 345 can be configured to convert the analog temperature signal ($T_{MON}$) to the digital temperature signal (TEMP). In the slave mode, the input ADC 345 is coupled to the digital-temperature bus 325 by a second slave switch 360 so that the digital temperature signal (TEMP) is transmitted onto the digital-temperature bus 325. In other words, the analog temperature signal ($T_{MON}$) is received at the driver 200 from the analog-temperature bus 350 and converted by the input ADC 345 to the digital temperature signal (TEMP) used for temperature compensation.

Figure 3:
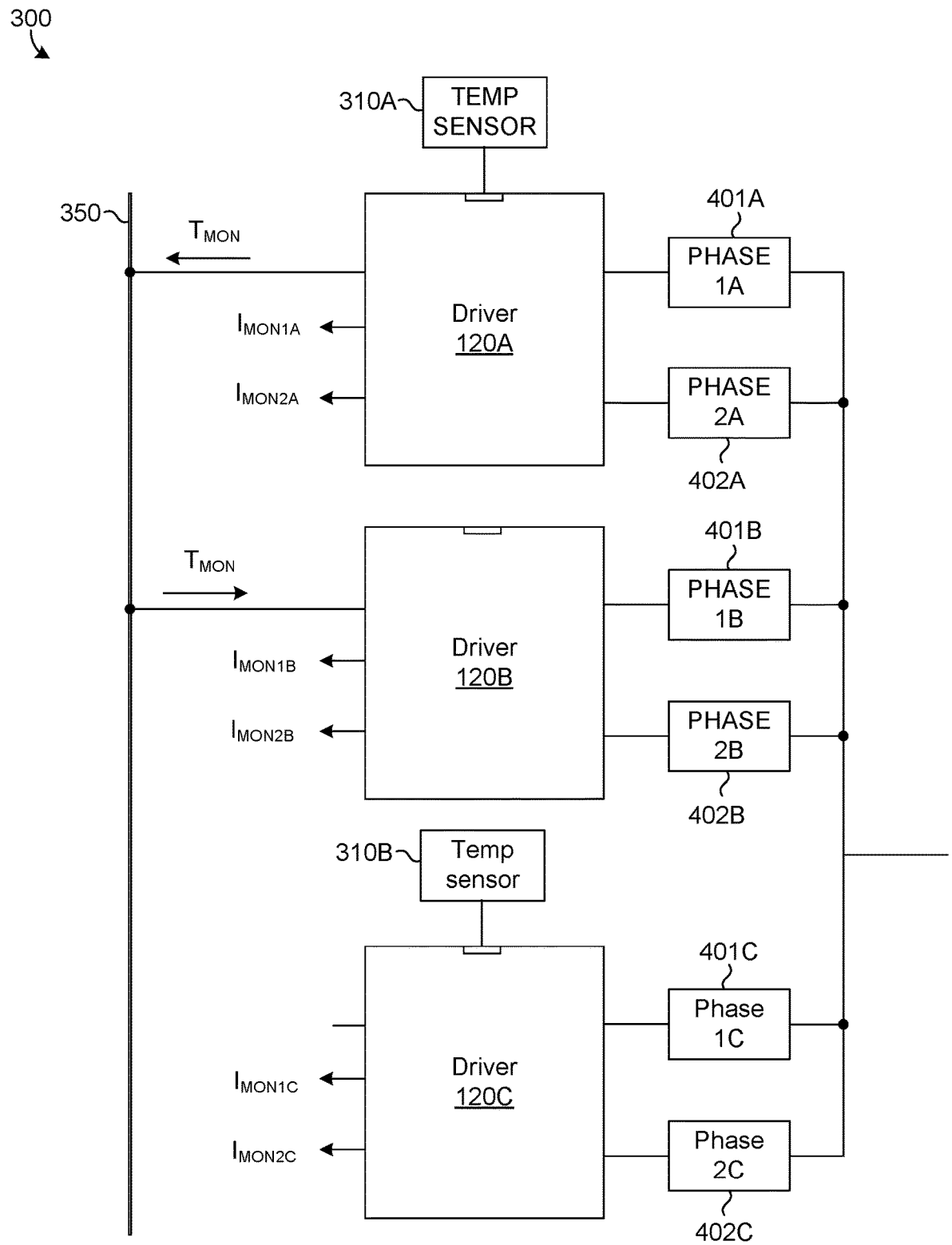
FIG. 3 is a block diagram of a portion of a multi-phase SMPS illustrating communication of the analog temperature signal and the thermally compensated sensed current signals according to a possible implementation of the present disclosure.

FIG. 3 is a block diagram of a portion of a multi-phase SMPS illustrating communication of the analog temperature signal and the thermally compensated sensed current signals. A SMPS with six phases and three drivers is shown but the disclosed techniques can be used with any number of drivers, each having any number of phases. The SMPS 300 portion shown includes a first driver 120A, a second driver 120B, and a third driver 120C. The first driver 120A is coupled directly to a first thermal sensor 310A (i.e., temperature sensor, temp sensor), while the second driver 120B is not coupled directly to any thermal sensor. As discussed, the direct connection to the first thermal sensor 310A may configure the first driver 120A in a master mode, while the absence of a direct connection to a thermal sensor may configure the second driver 120B in a slave mode. In the master mode, the first driver 120A can be configured to (i) receive a measured temperature signal from the first thermal sensor 310A, (ii) generate a corresponding digital temperature signal (TEMP), (iii) convert the digital temperature signal (TEMP) to an analog temperature signal ($T_{MON}$), and (iv) transmit the analog temperature signal ($T_{MON}$) to the analog-temperature bus 350. In the slave mode, the second driver 120B can be configured to (i) receive the analog temperature signal ($T_{MON}$) from the analog-temperature bus 350, (ii) convert the analog temperature signal ($T_{MON}$) to the digital temperature signal (TEMP), and (iii) transmit the digital temperature signal (TEMP) to the digital-temperature bus (not shown).

The first driver 120A is further configured to (i) sense phase currents from its first phase 401A and its second phase 402A (e.g., using DCR sensing) and (ii) generate a first thermally compensated sensed current ($I_{MON1A}$) and a second thermally compensated sensed current ($I_{MON2A}$) using the digital temperature signal (TEMP) created from the measured temperature signal from the first thermal sensor 310A. The second driver 120B is further configured to (i) sense phase currents from its first phase 401B and its second phase 402B (e.g., using DCR sensing) and (ii) generate a first thermally compensated sensed current ($I_{MON1B}$) and a second thermally compensated sensed current ($I_{MON2B}$) using the digital temperature signal (TEMP) converted from the analog temperature signal ($T_{MON}$) received from the analog-temperature bus 350.

The dual mode (i.e., master/slave) nature of the driver allows for many possible configurations. For example, the SMPS portion shown in FIG. 3 includes a third driver 120C that is directly coupled to a second thermal sensor 310B. The direct connection to the second thermal sensor 310B may configure the third driver 120C in a master mode. In the master mode, the third driver 120C can be configured to (i) receive a measured temperature signal from the second thermal sensor 310B, (ii) generate a corresponding digital temperature signal (TEMP), (iii) sense phase currents from its first phase 401C and its second phase 402C (e.g., using DCR sensing), and (iv) generate a first thermally compensated sensed current ($I_{MON1C}$) and a second thermally compensated sensed current ($I_{MON2C}$) using the digital temperature signal (TEMP) created from the measured temperature signal from the second thermal sensor 310B. The third driver 120C may not be coupled to the analog-temperature bus 350 to prevent two analog temperature signals from being transmitted to the analog-temperature bus 350. Accordingly, drivers may share or not share temperature information which can be used to create temperature compensated phase current measurements. It may be advantageous, however, to use one thermal sensor for multiple drivers because it can reduce a size, cost, and complexity of the SMPS. In these implementations, there may be one driver in master mode and one or more other drivers in slave mode.

Figure 4:
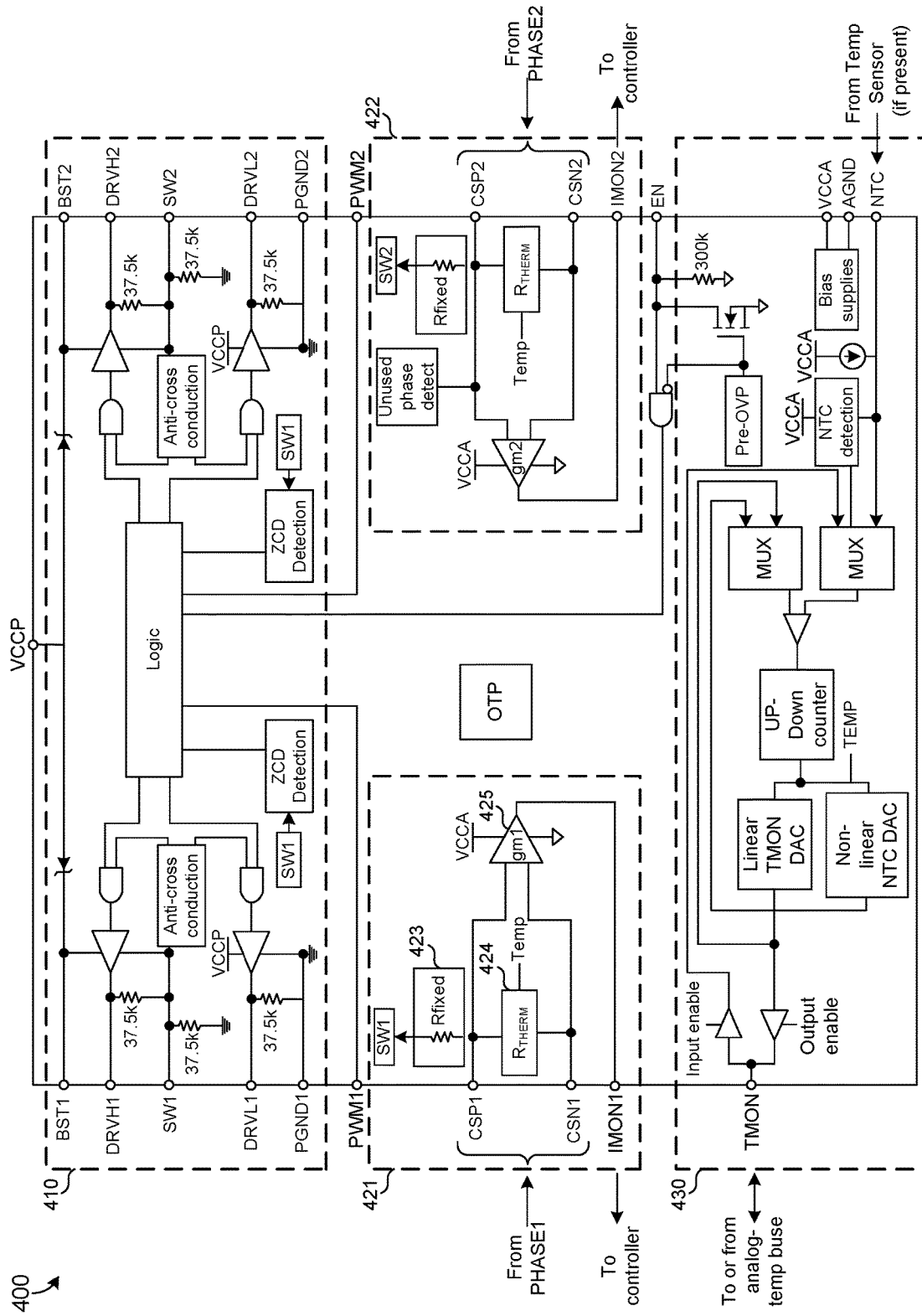
FIG. 4 is a detailed block diagram of a driver for a two phase SMPS according to a possible implementation of the present disclosure.

FIG. 4 is a detailed block diagram of a driver for a two phase SMPS according to a possible implementation of the present disclosure. The driver 400 may be implemented as an integrated circuit containing the circuits shown. The driver 400 includes a phase driving circuit 410. The phase driving circuit 410 is configured to create switching signals (DRVH1, DRVL1) to drive controlling terminals (e.g., gates) of transistors in a first phase based on a first switching signal (i.e., PWM1) and to create switching signals (DRVH2, DRVL2) to drive controlling terminals (e.g., gates) of transistors based on a second switching signal (i.e., PWM2). The first switching signal (PWM1) and the second switching signal (PWM2) can be received from a controller (not shown) coupled to the driver 400. The phase driving circuit includes components for logic and power translation.

The driver 400 further includes phase-current sensor circuits for each phase. In particular, the driver includes a first phase-current sensor 421 and a second phase-current sensor 422. The first phase-current sensor 421 and the second phase-current sensor 422 are configured to sense a phase current from the first phase and the second phase respectively. The first phase-current sensor 421 includes a fixed resistor 423 ($R_{FIXED}$) and a variable resistor 424 ($R_{THERM}$). The fixed resistor 423 and the variable resistor 424 can form a voltage divider, which can be adjusted by changing a resistance of the variable resistor. The resistance of the variable resistor is adjusted (i.e., controlled) by a digital temperature signal (TEMP), which corresponds to a temperature measurement generated by a temperature sensor coupled to the driver 400. Accordingly, the sensing of the phase current can compensate for changes to the phase (e.g., the DCR) caused by temperature. The change to the phase may have a nonlinear relationship with temperature. Accordingly, the adjustment of the variable resistor (i.e., voltage divider) can have a nonlinear response with temperature. The first phase-current sensor 421 can further include an amplifier 425 configured to serve as a buffer between a power domain (e.g., high power) of the first phase and a power domain (e.g., low power) of a controller coupled to the driver 400. The first phase-current sensor 421 is configured to output a temperature-compensated first sensed current ($I_{MON1}$). The second phase-current sensor 422, which includes similar aspects (e.g., the same components) as the first phase-current sensor 421, is configured to output a temperature-compensated second sensed current ($I_{MON2}$). Both the first phase-current sensor 421 and the second phase-current sensor 422 can receive the digital temperature signal (TEMP) from a digital-temperature bus 325.

The driver 400 further includes a temperature sensing circuit 430. The temperature sensing circuit 430 is configured to transmit an analog temperature signal ($T_{MON}$) to an analog-temperature bus when a temperature sensor (i.e., thermal sensor (NTC)) is coupled to in input of the driver 400, and to receive an analog temperature signal ($T_{MON}$) from the analog-temperature bus when the temperature sensor is not coupled to the input of the driver 400. Accordingly, the temperature sensing circuit 430 includes an NTC detection circuit that can determine the presence or absence of the temperature sensor at the input to the driver and based on the presence/absence configure the temperature sensing circuit in either a master mode or a slave mode as described previously. The master switches and the slave switches may be implemented as multiplexers (MUX) of the temperature sensing circuit. The temperature sensing circuit 430 is further configured to generate the digital temperature signal from either a signal received from the temperature sensor or a signal received from the analog temperature bus depending on the mode of the temperature sensing circuit 430.

Figure 5:
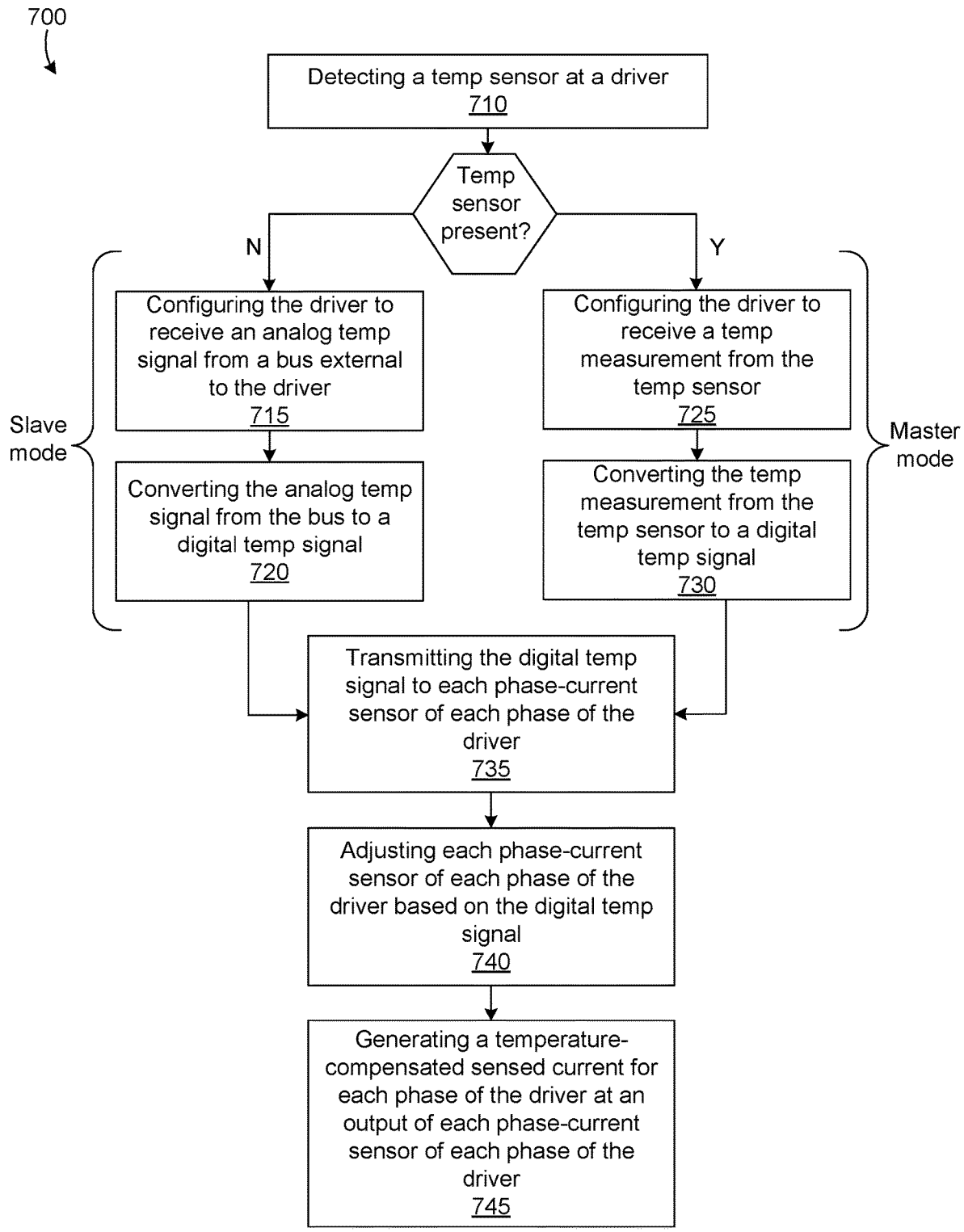
FIG. 5 is a method for generating a temperature compensated sensed current for each phase of a driver in a SMPS according to a possible implementation of the present disclosure.

FIG. 5 is a method for generating a temperature compensated sensed current for each phase of a driver in a SMPS according to a possible implementation of the present disclosure. The method 700 includes detecting 710 a temperature sensor at a driver. If the temperature sensor is present, then the driver is configured 725 to receive a temperature measurement from the temperature sensor, and the temperature measurement from the temperature sensor is converted 730 to a digital temperature signal. In other words, the driver operates in a master mode. If, however, the temperature sensor is not present, then the driver is configured to receive 715 an analog temperature signal from a bus that is external to the driver, and the analog temperature signal is converted 720 to a digital temperature signal. In other words, the driver operates in a slave mode. In either case, the method includes transmitting 735 the digital temperature signal to each phase-current sensor of the driver. The driver includes a phase-current sensor for each phase of the driver. The digital temperature signal received at each phase-current sensor adjusts 740 the phase-current sensor to generate 745 a temperature-compensated sensed current so that each phase-current sensor outputs a temperature-compensated sensed current for a phase of the driver.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. A driver for a phase of a switched mode power supply, comprising:
    an inductor configured to conduct a phase current to an output of the phase, the inductor including an inductance in series with a direct-current resistance;
    a capacitor and a fixed resistor coupled in parallel with the inductor, the capacitor configured to generate a first voltage corresponding to the phase current, the first voltage having a temperature dependence resulting from the direct-current resistance;
    a variable resistor coupled in series with the fixed resistor, the variable resistor having an adjustable resistance set according to a temperature signal based on a temperature of the phase; and
    a temperature sensor detection circuit configured to detect a temperature sensor coupled to the driver or not being coupled to the driver.

2. The driver according to claim 1, wherein:
    the capacitor is in series with the fixed resistor; and
    the variable resistor is in parallel with the capacitor and is in series with the fixed resistor.

3. The driver according to claim 1, wherein:
    the variable resistor set according to the temperature signal in order to generate a second voltage to compensate for the temperature dependence of the first voltage; and
    the phase is configured to output the second voltage as a sensed current signal corresponding to the phase current of the phase.

4. The driver according to claim 3, wherein the sensed current signal is invariant to a temperature change over a range of temperatures from zero degrees Celsius to 100 degrees Celsius.

5. The driver according to claim 1, wherein the temperature signal corresponds to a measured temperature of the phase received from the temperature sensor when the temperature sensor detection circuit detects the temperature sensor being coupled directly to the driver.

6. The driver according to claim 5, further comprising:
    a thermal analog-to-digital converter that is configured to convert the measured temperature into the temperature signal, the temperature signal being a digital temperature signal.

7. The driver according to claim 6, wherein analog-to-digital converter has a nonlinear conversion so that the adjustable resistance is set according to a nonlinear response to the measured temperature.

8. The driver according to claim 1, wherein the driver is a first driver of a first phase and the temperature signal corresponds to a measured temperature transmitted to the first driver from a second driver over an analog-temperature bus connecting the first driver and the second driver when the temperature sensor detection circuit detects no temperature sensor being coupled directly to the first driver.

9. The driver according to claim 8, wherein:
    the first driver is configured to operate in a slave mode in which the first driver is configured to generate the temperature signal from the measured temperature received from the analog-temperature bus; and
    the second driver is configured to operate in a master mode in which the second driver is configured to generate the temperature signal from the measured temperature received from the temperature sensor coupled directly to the driver.

10. The driver according to claim 9, wherein:
    the first driver configures switches in the first driver to operate in the slave mode instead of the master mode; and
    the second driver configures switches in the second driver to operate in the master mode instead of the slave mode.

11. The driver according to claim 8, the first driver and the second driver each include a sensor detection circuit configured to configure each driver into a master mode or a slave mode based on a presence or an absence of the temperature sensor being directly coupled to each driver.

12. A switch mode power supply (SMPS) comprising:
a controller configured to output switching signal based on a sensed current from a phase of the switch mode power supply; and
a driver configured to, based on the switching signal, generate a phase current, the driver including:
an inductor configured to conduct the phase current to an output of the phase, the inductor including an inductance in series with a direct-current resistance;
a capacitor in series with a fixed resistor, the fixed resistor and the capacitor coupled in parallel with the inductor, the capacitor configured to generate a first voltage corresponding to the phase current;
a variable resistor coupled in parallel with the capacitor and in series with the fixed resistor; the variable resistor configured generated a second voltage corresponding to the first voltage by a resistance of the variable resistor; and
a temperature sensor detection circuit configured to detect a temperature sensor coupled to the driver.

13. The switch mode power supply according to claim 12, wherein:
the first voltage has a temperature dependence resulting from the direct-current resistance; and
the resistance of the variable resistor is set according to a temperature signal in order to compensate for the temperature dependence.

14. The switch mode power supply according to claim 13 wherein the driver is configured to output the second voltage as a temperature-compensated sensed current of the phase.

15. The switch mode power supply according to claim 13, wherein:
the temperature signal corresponds to a measured temperature from the temperature sensor coupled directly to the driver when the temperature sensor detection circuit detects the temperature sensor being coupled directly to the driver.

16. The switch mode power supply according to claim 15, wherein:
the phase is not coupled to an analog temperature bus configured to transmit an analog temperature signal.

17. The switch mode power supply according to claim 13, wherein
the driver is a first driver; and
the temperature signal corresponds to a received temperature from a analog-temperature bus coupling the first driver to a second driver when the temperature sensor detection circuit does not detect the temperature sensor being coupled directly to the driver.

18. The switch mode power supply according to claim 15, further comprising:
a thermal analog-to-digital converter that is configured to convert an analog temperature into the temperature signal, the temperature signal being a digital temperature signal.

19. The switch mode power supply according to claim 18, wherein analog-to-digital converter has a nonlinear conversion so that the resistance of the variable resistor is set according to a nonlinear response of the thermal analog-to-digital converter to the measured temperature.

* * * * *